PIEZOELECTRIC CERAMIC COMPOSITIONS

Filed Dec. 8, 1965 2 Sheets-Sheet 1

INVENTORS
HIROMU OUCHI
MASAMITSU NISHIDA

BY Wenderoth, Lind & Ponack,
ATTORNEYS

INVENTORS
HIROMU OUCHI
MASAMITSU NISHIDA

BY Wenderoth, Lind & Ponack
ATTORNEYS

United States Patent Office 3,400,076

Patented Sept. 3, 1968

3,400,076

PIEZOELECTRIC CERAMIC COMPOSITIONS

Hiromu Ouchi, Toyonaka-shi, Osaka-fu, and Masamitsu Nishida, Osaka-shi, Osaka-fu, Japan, assignors to Matsushita Electric Industrial Co., Ltd., Osaka, Japan Filed Dec. 8, 1965, Ser. No. 512,323
7 Claims. (Cl. 252—62.9)

This invention relates to piezoelectric ceramic compositions and articles of manufacture fabricated therefrom. More particularly, the invention pertains to novel ferroelectric ceramics which are polycrystalline aggregates of certain constituents. These piezoelectric compositions are sintered to ceramics by per se conventional ceramic techniques and thereafter the ceramics are polarized by applying a direct current voltage between the electrodes to impart thereto electromechanical transducing properties similar to the well known piezoelectric effect. The invention also encompasses the calcined product of raw ingredients and the articles of manufacture such as electromechanical transducers fabricated from the sintered ceramic.

The ceramic bodies materialized by the present invention exist basically in the following solid solution: (1) the binary system $Pb(Mg_{1/3}Ta_{2/3})O_3$—$PbTiO_3$, and (2) the tenary system $Pb(Mg_{1/3}Ta_{2/3})O_3$—$PbTiO_3$—$PbZrO_3$.

The use of piezoelectric materials in various transducer applications in the production, measurement and sensing of sound, shock, vibration, pressure, etc. has increased greatly in recent years. Both crystal and ceramic types of transducers have been widely used. But, because of their potentially lower cost and facility in the fabrication of ceramics with various shapes and sizes and their greater durability for high temperature and/or for humidity than that of crystalline substances such as Rochelle salt, piezoelectric ceramic materials have recently become important in various transducer applications.

The piezoelectric characteristics of ceramics required apparently vary with species of applications. For example, electromechanical transducers such as phonograph pickup and microphone require piezoelectric ceramics characterized by a substantially high electromechanical coupling coefficient and dielectric constant. On the other hand, piezoelectric ceramics for electric wave filters should have a specified value of coupling coefficient. Furthermore, ceramic materials require a high stability with temperature and time in resonant frequency and in other electrical properties.

As more promising ceramics for these requirements, lead titanate-lead zirconate is in wide use. However, it is difficult to sinter the lead titanate-lead zirconate ceramics for evaporation of PbO. And the dielectric and piezoelectric properties of the lead titanate-lead zirconate ceramics vary greatly with firing technique.

It is, therefore, the fundamental object of the present invention to provide novel piezoelectric ceramic materials which overcome at least one of the problems outlined above.

A more specific object of the invention is to provide novel polycrystalline ceramic materials characterized by high relative dielectric constant and piezoelectric response.

Another object of the invention is to provide ceramic compositions suitable for use in electromechanical transducers over a wide temperature range.

A further object of the invention is the provision of piezoelectric ceramics characterized by a high stability in resonant frequency with operating temperature suitable for use in electromechanical wave filters.

A still further object of the invention is the provision of novel piezoelectric ceramic compositions, certain properties of which can be adjusted to suit various applications.

These objects of the invention and the manner of their attainment will be clear from the following description and from the accompanying drawings, in which.

Figure 1:
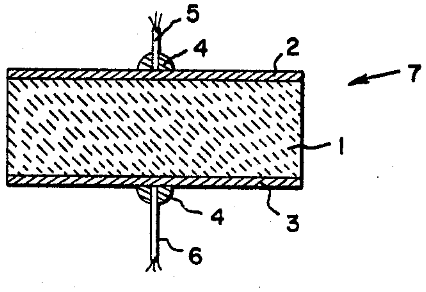
FIG. 1 is a cross-sectional view of an electromechanical transducer embodying the present invention.

Before proceeding with a detailed description of the piezoelectric materials contemplated by the invention, their application in electromechanical transducers will be described with reference to FIG. 1 of the drawings wherein reference character 7 designates, as a whole, an electromechanical transducer having, as its active element, a preferably disc-shaped body 1 of piezoelectric ceramic material according to the present invention.

Body 1 is electrostatically polarized, in a manner hereinafter set forth, and is provided with a pair of electrodes 2 and 3 applied in a suitable and per se conventional manner, on two opposed surfaces thereof. Wire leads 5 and 6 are attached conductively to the electrodes 2 and 3 respectively by means of solder 4. When the ceramic is subjected to shock, vibration, or other mechanical stress, electrical output generated can be taken from wire leads 5 and 6. Conversely, as with other piezoelectric transducers, application of electrical voltage to electrodes 5 and 6 will result in mechanical deformation of the ceramic body.

It is to be understood that the term electromechanical transducer as used herein is taken in its broadest sense and includes piezoelectric filters, frequency control devices, and the like, and that the invention can also be used and adapted for various other applications requiring materials having dielectric, piezoelectric and/or electrostrictive properties.

According to the present invention, the ceramic body 1, FIG. 1, is formed of novel piezoelectric compositions which are polycrystalline ceramics composed of $$Pb(Mg_{1/3}Ta_{2/3})O_3$$

in said solution with $PbTiO_3$ and $PbZrO_3$.

It has been found that a solid solution in a perovskite-type structure is formed from a mixture of $$Pb(Mg_{1/3}Ta_{2/3})O_3$$

and $PbTiO_3$ in all proportions. The solid solution has a morphotropic phase boundary between a composition 59.0 to 62.5 mole percent of $Pb(Mg_{1/3}Ta_{2/3})O_3$ and 41.0 to 37.5 mole percent of $PbTiO_3$. The planar piezoelectric coupling coefficient is the highest at a vicinity of morphotropic composition and becomes lower as a composition departs from the morphotropic composition. Further, it has been found that a ternary system of $Pb(Mg_{1/3}Ta_{2/3})O_3$, $PbTiO_2$ and $PbZrO_3$ also exists in a solid solution in all compositions. The piezoelectric property is much more improved in the ternary system than in the above binary system, and is excellent at a vicinity of morphotropic composition. The solid solution of ternary system exists in a perovskite-type structure of $Pb(Mg_{1/3}Ta_{2/3})O_3$ which is modified by partially replacing sites of $(Mg_{1/3}Ta_{2/3})O_3$ with Ti and/or Zr. Since $Pb(Mg_{1/3}Ta_{2/3})O_3$ exists in a perovskite-type structure expressed by the general formula of $A^{2+}B^{4+}O_3^{2-}$, where A is a divalent ion; B is a tetravalent ion; and O is an oxygen ion, the atomic ratio of Mg:Ta in B site should be 1:2 to make the solid solution crystal neutral in electricity.

The present invention has various advantages in manufacturing process and in application to ceramic transducers. It has been known that the evaporation of PbO during firing is a problem in the sintering of lead compounds such as lead titanate zirconate. The invented composition, however, shows a smaller amount of evaporated PbO than usual lead titanate zirconate does. The ternary system can be fired without any particular control of PbO atmosphere. A well sintered body of present composition is obtained by firing in a ceramic crucible with a ceramic cover made of $Al_2O_3$ ceramics. A high sintering density is desirable for humidity resistance and high piezoelectric response when the sintered body is applied to a resonator and other devices.

Figure 2:
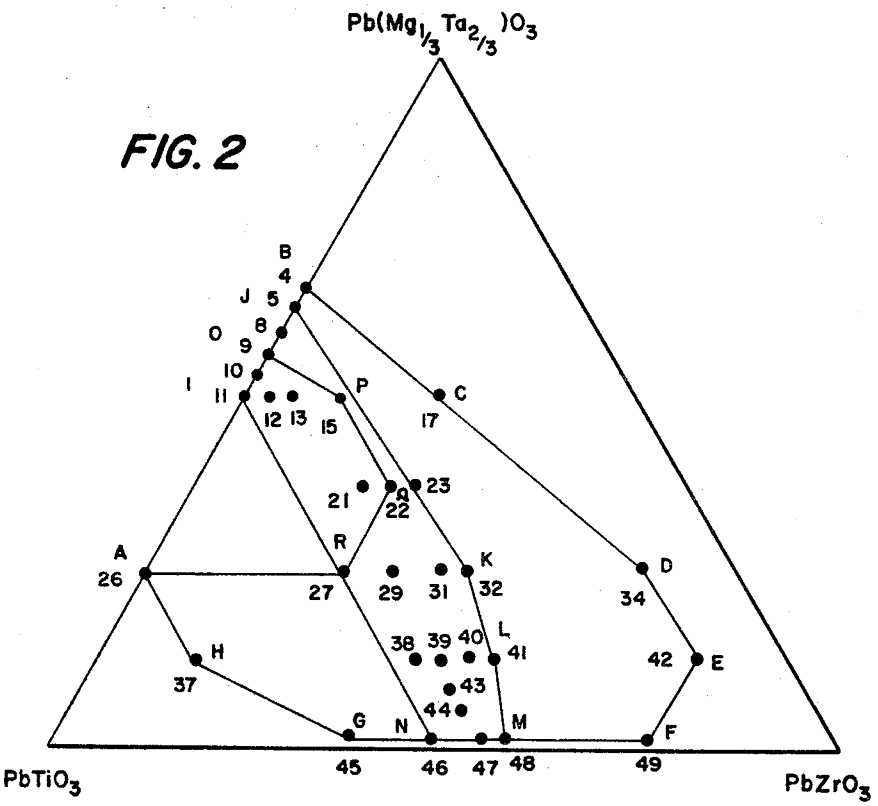
FIG. 2 is a triangular compositional diagram of materials utilized in the present invention.
Figure 3:
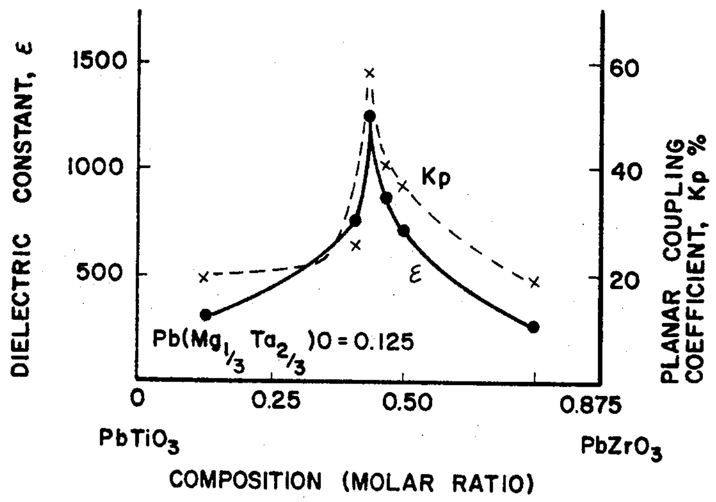
FIG. 3 is a graph showing the effect of compositional change on relative dielectric constant ($\epsilon$) and planar coupling coefficient ($Kp$) of exemplary compositions according to the present invention at 20° C. and 1 kc.

All possible compositions coming within the ternary system $Pb(Mg_{1/3}Ta_{2/3})O_3$—$PbO_3$—$PbZrO_3$ are represented by the triangular diagram constituting FIG 2 of the drawings. Some compositions represented by the diagram, however, do not exhibit high piezoelectricity, and many are electromechanically active only to a slight degree. The present invention is concerned only with those compositions exhibiting piezoelectric response of appreciable magnitude. As a matter of convenience, the planar coupling coefficient ($Kp$) of test discs will be taken as a measure of piezoelectric activity. Thus, within the area bounded by lines connecting points ABCDEFGH, FIG. 2, all compositions polarized and tested showed a planar coupling coefficient of at least 20 percent. Particularly, the compositions in the area of the digaram bounded by lines connecting points IJKLMN, FIG. 2, retain a high planar coupling coefficient ($Kp$) of approximately 30 percent or higher. The molar percentage of the three components of compositions ABCDEFGHIJKLMN are as follows:

| | $Pb(Mg_{1/3}Ta_{2/3})O_3$ | $PbTiO_3$ | $PbZrO_3$ |
|---|---|---|---|
| A | 25.0 | 75.0 | 0 |
| B | 65.5 | 34.5 | 0 |
| C | 50.0 | 25.0 | 25.0 |
| D | 25.0 | 12.5 | 62.6 |
| E | 12.5 | 12.5 | 75.0 |
| F | 1.0 | 24.0 | 75.0 |
| G | 1.0 | 61.5 | 37.5 |
| H | 12.5 | 75.0 | 12.5 |
| I | 50.0 | 50.0 | 0 |
| J | 62.5 | 37.5 | 0 |
| K | 25.0 | 34.5 | 40.5 |
| L | 12.5 | 37.5 | 50.0 |
| M | 1.0 | 42.0 | 57.0 |
| N | 1.0 | 51.0 | 48.0 |

Furthermore, the compositions near the morphotropic phase boundary, particularly $Pb(Mg_{1/3}Ta_{2/3})_{0.375}Ti_{0.405}Zr_{0.220}O_3$,
$Pb(Mg_{1/3}Ta_{2/3})_{0.250}Ti_{0.375}Zr_{0.375}O_3$,
$Pb(Mg_{1/3}Ta_{2/3})_{o]}{}_{.250}Ti_{0.375}Zr_{0.375}O_3$,
$Pb(Mg_{1/3}Ta_{2/3})_{0.125}Ti_{0.435}Zr_{0.440}O_3$,
$Pb(Mg_{1/3}Ta_{2/3})_{0.050}Ti_{0.450}Zr_{0.500}O_3$, give ceramic products having a planar coupling coefficient of 45 percent or higher.

Figure 4:
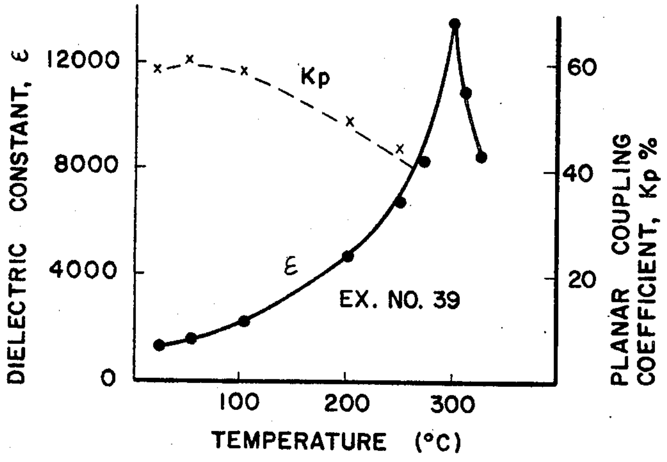
FIG. 4 is a graph showing the temperature dependence of relative dielectric constant ($\epsilon$) and planar coupling coefficient ($Kp$) of exemplary compositions according to the present invention.

All the piezoelectric ceramics according to the present invention can be used as electromechanical transducers over a wide temperature range from room temperature (about 20° C) to about 150° C. FIG. 4 exemplifies this.

The compositions in the area of the diagram bounded by lines connecting points AOPQR, FIG. 2, show a high stability in resonant frequency, with temperature within the range 20° C. to 85° C., the molar percentage of the three components of compositions AOPQR being as follows:

| | $Pb(Mg_{1/3}Ta_{2/3})O_3$ | $PbTiO_3$ | $PbZrO_3$ |
|---|---|---|---|
| A | 25.0 | 75.0 | 0 |
| O | 56.0 | 44.0 | 0 |
| P | 50.0 | 37.5 | 12.5 |
| Q | 37.5 | 37.5 | 25.0 |
| R | 25.0 | 50.0 | 25.0 |

These composition yield in resonant frequency with temperature less than 0.66 percent.

According to the present invention, dielectric and piezoelectric properties of the ceramics can be adjusted to suit various applications by selecting the proper composition.

The compositions described herein can be prepared in accordance with various per se well known ceramic procedures. A preferred method, however, hereinafter more fully described, consists in the use of PbO or $Pb_3O_4$, MgO or $MgCO_3$, $Ta_2O_5$, $TiO_2$ and $ZrO_2$.

The starting materials, viz., lead oxide (PbO), magnesia (MgO), tantalum pentoxide ($Ta_2O_5$), Titania ($TiO_2$), and zirconia ($ZrO_2$), all of relatively pure grade (e.g., C.P. grade) are intimately mixed in a rubber-lined ball mill with distilled water. In milling the mixture, care should be exercised to avoid, or the proportions of ingredients varied to compensate for, contamination by wear of the milling balls or stones.

Following the wet milling, the mixture is dried and mixed to assure as homogeneous a mixture as possible. Thereafter, the mixture is suitably formed into desired forms at a pressure of 400 kilograms per square centimeter. The compacts are pre-reacted by calcination at a temperature of around 850° C. for 2 hours.

After calcination, the reacted material is allowed to cool and is then wet milled to a small particle size. Once again, care should be exercised to avoid, or the proportions of ingredients varied to compensate for, contamination by wear of the milling balls or stones. Depending on preference and the shapes desired, the material may be formed into a mix or slip suitable for pressing, slip casting, or extruding, as the case may be, in accordance with per se conventional ceramic procedures. A typical sample for which data are given hereinbelow is prepared by mixing 100 grams of milled presintered mixture with 5 milliliters of distilled water. The mix is then pressed into discs of 20 millimeters diameter and 2 millimeters thickness at a temperature indicated in the table which follows, and are then fired for 45 minutes of heating period. According to the present invention, there is no need to fire the composition in an atmosphere of PbO and no special care is required for the temperature gradient in a furnace when compared with the prior art. Thus, according to the present invention, uniform and excellent piezoelectric ceramic products can be easily obtained simply by covering the samples with an alumina crucible.

The sintered ceramics are polished on both surfaces to the thickness of one millimeter. The polished disc surfaces are then coated with silver paint and fired to form silver electrodes. Finally, the discs are polarized while being immersed in a bath of silicone oil at 100° C. A voltage gradient of kv. per millimeter (direct current) is maintained for one hour, and the discs are field-cooled to room temperature in thirty minutes.

The dielectric and piezoelectric properties of the polarized specimen, measures at 20° C. in a relative humidity of 50% and at a frequency of 1 kc. are listed in the table. Measurement of the piezoelectric properties is made by the IRE standard circuit and the planar coupling coefficient is determined by the resonant to antiresonant frequency method.

The specimen number in the table and the compositional regions according to the present invention are shown in FIG. 2, which represents the triangular compositional diagram of solid solution $$Pb(Mg_{1/3}Ta_{2/3})O_3—PbTiO_3—PbZrO_3$$

Compositions defined by the polygon ABCDEFGH have characteristics as described hereinbefore and shown in detail in the table. With ceramic compositions containing $Pb(Mg_{1/3}Ta_{2/3})O_3$ more than 65.5 mol percent, the piezoelectricity is weak and their planar coupling coefficient is low. For this reason they are excluded from the scope of the present invention. The compositions containing a small amount of $Pb(Mg_{1/3}Ta_{2/3})O_3$ exist in a poorly sintered body which results in low piezoelectric properties.

Therefore, the ceramic compositions should contain more than one mole percent of $Pb(Mg_{1/3}Ta_{2/3})O_3$. On the other hand, those compositions containing 75.0 mole percent or more of $PbTiO_3$ exhibit a poor sinter-ability and accordingly have low piezoelectric properties. Therefore, they also are excluded from the scope of the present invention. Further, ceramic compositions containing 75.0 mol percent or more of $PbZrO_3$ have only a low piezoelectricity at about room temperature and are also excluded from the scope of the present invention. Almost all the ceramic compositions according to the present invention exhibit a planar coupling coefficient of higher than 20%. Furthermore, the compositions near the morphotropic phase boundary, particularly $Pb(Mg_{1/3}Ta_{2/3})_{0.375}Ti_{0.405}Zr_{0.220}O_3$,
$Pb(Mg_{1/3}Ta_{2/3})_{0.250}Ti_{0.375}Zr_{0.375}O_3$,
$Pb(Mg_{1/3}Ta_{2/3})_{0.125}Ti_{0.435}Zr_{0.440}O_3$,
$Pb(Mg_{1/3}Ta_{2/3})_{0.080}Ti_{0.450}Zr_{0.470}O_3$, and
$Pb(Mg_{1/3}Ta_{2/3})_{0.050}Ti_{0.450}Zr_{0.500}O_3$ give piezoelectric ceramics having a planar coupling coefficient of higher than 45%.

In addition to the superior properties shown above, compositions according to the present invention yield ceramics of good physical quality and which polarize well. It will be understood from the foregoing that the ternary solid solution $$Pb(Mg_{1/3}Ta_{2/3})O_3—PbTiO_3—PbZrO_3$$

forms an excellent piezoelectric ceramic body.

While there have been described what at present are believed to be the preferred embodiments of this invention, various changes and modifications can be made therein without departing from the invention, and it is aimed, therefore, to cover in the appended claims all such changes and modifications as fall within the true spirit and scope of the invention.

TABLE

| Example No. | Mole percent of composition: $Pb(Mg_{1/3}Ta_{2/3})O_3$ | Mole percent of composition: $PbTiO_3$ | Mole percent of composition: $PbZrO_3$ | Firing Temp., ° C. | Density, gm./cm.³ | 24 hours after poling: Dielectric Constant ε, at 1 kc., P.S. | Dissipa-D, in percent at 1 kc., P.S. | Planar Coupling Coeff. Kp, in percent | Resonant Resistance, R, Ω | Mechanical Quality Factor, $Q_M$ | Temperature Change in Resonant Frequency,[1] percent |
|---|---|---|---|---|---|---|---|---|---|---|---|
| 4 | 65.5 | 34.5 | 0 | 1,290 | 8.59 | 4,688 | 2.85 | 21.3 | 34.5 | 92 | ---------- |
| 5 | 62.5 | 37.5 | 0 | 1,280 | 8.81 | 5,830 | 2.30 | 36.9 | 11.7 | 74 | ---------- |
| 8 | 59.0 | 41.0 | 0 | 1,280 | 8.73 | 2,815 | 1.26 | 34.2 | 13.6 | 137 | ---------- |
| 9 | 56.0 | 44.0 | 0 | 1,280 | 8.74 | 2,219 | 1.05 | 33.5 | 15.9 | 160 | −0.66 |
| 10 | 53.0 | 47.0 | 0 | 1,280 | 8.46 | 1,366 | 0.91 | 27.0 | 29.6 | 203 | ---------- |
| 11 | 50.0 | 50.0 | 0 | 1,280 | 8.43 | 1,195 | 0.96 | 27.1 | 32.6 | 208 | −0.40 |
| 12 | 50.0 | 46.5 | 3.5 | 1,250 | 8.50 | 1,401 | 1.17 | 28.6 | 28.1 | 178 | −0.36 |
| 13 | 50.0 | 43.5 | 6.5 | 1,250 | 8.60 | 2,498 | 1.42 | 37.2 | 15.3 | 123 | 0.11 |
| 15 | 50.0 | 37.5 | 12.5 | 1,250 | 8.61 | 3,336 | 2.00 | 37.8 | 15.2 | 92 | 0.56 |
| 17 | 50.0 | 25.0 | 25.0 | 1,250 | 8.61 | 2,103 | 3.21 | 23.6 | 34.0 | 151 | 2.35 |
| 21 | 37.5 | 40.5 | 22.0 | 1,250 | 8.32 | 2,308 | 1.88 | 45.1 | 15.8 | 92 | −0.52 |
| 22 | 37.5 | 37.5 | 25.0 | 1,260 | 8.24 | 2,029 | 2.38 | 36.7 | 22.7 | 107 | −0.55 |
| 23 | 37.5 | 34.5 | 28.0 | 1,250 | 8.17 | 1,665 | 2.97 | 33.8 | 32.1 | 109 | ---------- |
| 26 | 25.0 | 75.0 | 0 | 1,280 | 8.05 | 444 | 1.06 | 21.9 | 84.6 | 309 | −0.55 |
| 27 | 25.0 | 50.0 | 25.0 | 1,260 | 8.00 | 1,242 | 1.26 | 39.7 | 25.9 | 122 | −0.56 |
| 29 | 25.0 | 43.5 | 31.5 | 1,250 | 7.92 | 1,766 | 1.88 | 44.3 | 23.1 | 87 | −0.91 |
| 31 | 25.0 | 37.5 | 37.5 | 1,250 | 8.10 | 1,182 | 2.64 | 50.2 | 23.9 | 91 | −2.60 |
| 32 | 25.0 | 34.5 | 40.5 | 1,250 | 7.91 | 1,152 | 3.07 | 30.1 | 45.2 | 123 | ---------- |
| 34 | 25.0 | 12.5 | 62.5 | 1,280 | 8.06 | 788 | 2.99 | 20.3 | 65.9 | 260 | ---------- |
| 37 | 12.5 | 75.0 | 12.5 | 1,290 | 6.83 | 315 | 1.33 | 19.6 | 202.0 | 289 | −1.13 |
| 38 | 12.5 | 46.5 | 41.0 | 1,250 | 7.60 | 761 | 1.56 | 26.2 | 82.3 | 149 | ---------- |
| 39 | 12.5 | 43.5 | 44.0 | 1,290 | 7.80 | 1,247 | 1.95 | 58.0 | 21.1 | 76 | −2.28 |
| 40 | 12.5 | 40.5 | 47.0 | 1,290 | 7.59 | 867 | 2.64 | 40.6 | 47.9 | 102 | ---------- |
| 41 | 12.5 | 37.5 | 50.0 | 1,290 | 7.76 | 712 | 2.99 | 36.8 | 57.5 | 118 | ---------- |
| 42 | 12.5 | 12.5 | 75.0 | 1,260 | 7.76 | 364 | 2.95 | 19.3 | 128.0 | 271 | ---------- |
| 43 | 8.0 | 45.0 | 47.0 | 1,280 | -------- | 1,173 | 2.18 | 53.2 | 158.0 | ---------- | ---------- |
| 44 | 5.0 | 45.0 | 50.0 | 1,280 | -------- | 1,048 | 2.26 | 51.0 | 25.5 | ---------- | ---------- |
| 45 | 1.0 | 61.5 | 37.5 | 1,280 | -------- | 372 | 2.71 | 19.5 | 194.0 | 236 | ---------- |
| 46 | 1.0 | 51.0 | 48.0 | 1,270 | 7.18 | 532 | 1.11 | 26.0 | 119.0 | 147 | ---------- |
| 47 | 1.0 | 45.0 | 54.0 | 1,260 | 7.17 | 731 | 1.52 | 39.0 | 53.0 | 121 | ---------- |
| 48 | 1.0 | 42.0 | 57.0 | 1,260 | 7.04 | 453 | 2.36 | 30.6 | 115.0 | 136 | ---------- |
| 49 | 1.0 | 24.0 | 75.0 | 1,260 | 7.00 | 278 | 3.55 | 20.6 | 171.0 | 245 | ---------- |

[1] $\frac{fr.\,(85°\,C.)-(fr.\,(20°\,C.)}{fr.\,(20°\,C.)}\times 100\%$; fr. (85° C.) and fr. (20° C.) are resonant frequency at 85° C. and 20° C., respectively.

What is claimed is:

1. As a novel composition of matter, a solid solution consisting essentially of a material selected from those defined by and included within polygonal area

ABCDEFGH of the triangular composition diagram in FIG. 2, wherein ABCDEFGH have the following compositions in molar ratio:

| | $Pb(Mg_{1/3}Ta_{2/3})O_3$ | $PbTiO_3$ | $PbZrO_3$ |
|---|---|---|---|
| A | 0.250 | 0.750 | 0.000 |
| B | 0.655 | 0.345 | 0.000 |
| C | 0.500 | 0.250 | 0.250 |
| D | 0.250 | 0.125 | 0.625 |
| E | 0.125 | 0.125 | 0.750 |
| F | 0.010 | 0.240 | 0.750 |
| G | 0.010 | 0.615 | 0.375 |
| H | 0.125 | 0.750 | 0.125 |

2. As a novel piezoelectric ceramic composition of matter, a solid solution consisting essentially of a material selected from those defined by and included within polygonal area IJKLMN of the triangular composition diagram in FIG. 2, wherein IJKLMN have the following compositions in molar ratio:

| | $Pb(Mg_{1/3}Ta_{2/3})O_3$ | $PbTiO_3$ | $PbZrO_3$ |
|---|---|---|---|
| I | 0.500 | 0.500 | 0.000 |
| J | 0.625 | 0.375 | 0.000 |
| K | 0.250 | 0.345 | 0.405 |
| L | 0.125 | 0.375 | 0.500 |
| M | 0.010 | 0.420 | 0.570 |
| N | 0.010 | 0.510 | 0.480 |

3. As a novel article of manufacture, an electro-mechanical transducer having an active element formed of a ceramic material which is a solid solution consisting essentially of a material selected from those defined by and included with polygonal area IJKLMN of the triangular composition diagram in FIG. 2, wherein IJKLMN have the following compositions in molar ratio:

| | $Pb(Mg_{1/3}Ta_{2/3})O_3$ | $PbTiO_3$ | $PbZrO_3$ |
|---|---|---|---|
| I | 0.500 | 0.500 | 0.000 |
| J | 0.625 | 0.375 | 0.000 |
| K | 0.250 | 0.345 | 0.405 |
| L | 0.125 | 0.375 | 0.500 |
| M | 0.010 | 0.420 | 0.570 |
| N | 0.010 | 0.510 | 0.480 |

4. An electromechanical transducer element comprising an electrostatically polarized solid solution ceramic consisting essentially of a material selected from the area AOPQR of the diagram of FIG. 2, wherein AOPQR have the following composition in molar ratio:

| | $Pb(Mg_{1/3}Ta_{2/3})O_3$ | $PbTiO_3$ | $PbZrO_3$ |
|---|---|---|---|
| A | 0.250 | 0.750 | 0.000 |
| O | 0.560 | 0.440 | 0.000 |
| P | 0.500 | 0.375 | 0.125 |
| Q | 0.375 | 0.375 | 0.250 |
| R | 0.250 | 0.500 | 0.250 |

5. A novel composition of matter, a piezoelectric ceramic material consisting essentially of a solid solution having one of the following formulae:

$$Pb(Mg_{1/3}Ta_{2/3})_{0.375}Ti_{0.405}Zr_{0.220}O_3;$$
$$Pb(Mg_{1/3}Ta_{2/3})_{0.250}Ti_{0.375}Zr_{0.375}O_3;$$
$$Pb(Mg_{1/3}Ta_{2/3})_{0.125}Ti_{0.435}Zr_{0.440}O_3;$$
$$Pb(Mg_{1/3}Ta_{2/3})_{0.080}Ti_{0.450}Zr_{0.470}O_3; \text{ and}$$
$$Pb(Mg_{1/3}Ta_{2/3})_{0.050}Ti_{0.450}Zr_{0.500}O_3.$$

6. A novel article of manufacture, an electromechanical transducer having an active element formed of a ceramic material consisting essentially of a solid solution having one of the following formulae:

$$Pb(Mg_{1/3}Ta_{2/3})_{0.375}Ti_{0.405}Zr_{0.220}O_3;$$
$$Pb(Mg_{1/3}Ta_{2/3})_{0.250}Ti_{0.375}Zr_{0.375}O_3;$$
$$Pb(Mg_{1/3}Ta_{2/3})_{0.125}Ti_{0.435}Zr_{0.440}O_3;$$
$$Pb(Mg_{1/3}Ta_{2/3})_{0.080}Ti_{0.450}Zr_{0.470}O_3;$$
$$Pb(Mg_{1/3}Ta_{2/3})_{0.050}Ti_{0.450}Zr_{0.500}O_3.$$

7. A piezoelectric ceramic composition consisting essentially of a solid solution of $Pb(Mg_{1/3}Ta_{2/3})O_3$, $PbTiO_3$ and $PbZrO_3$, said material having the following empirical formula $Pb(Mg_{1/3}Ta_{2/3})_xTi_yZr_zO_3$ wherein the subscripts denote mole fraction and have the following value $$x=0.010$$

to 0.655; $y=0.125$ to 0.750; $z=0$ to 0.750;

$$x+y+z=1.000$$

References Cited

UNITED STATES PATENTS

| | | | |
|---|---|---|---|
| 3,068,177 | 12/1962 | Sudgen | 252—62.9 |
| 3,268,453 | 8/1966 | Ouchi et al. | 252—62.9 |

TOBIAS E. LEVOW, *Primary Examiner.*

ROBERT D. EDMONDS, *Assistant Examiner.*